(12) United States Patent
Renon et al.

(10) Patent No.: US 11,099,242 B2
(45) Date of Patent: Aug. 24, 2021

(54) DEVICE FOR MEASURING AN ELECTRIC AND/OR MAGNETIC FIELD IN PARTICULAR IN A CONDUCTOR FOR TRANSPORTING ELECTRICAL POWER

(71) Applicant: Supergrid Institute, Villeurbanne (FR)

(72) Inventors: Geoffrey Renon, Villeurbanne (FR); Paul Vinson, Lyons (FR)

(73) Assignee: Supergrid Institute, Villeurbanne (FR)

( * ) Notice: Subject to any disclaimer, the term of this patent is extended or adjusted under 35 U.S.C. 154(b) by 0 days.

(21) Appl. No.: 16/772,081

(22) PCT Filed: Dec. 18, 2018

(86) PCT No.: PCT/FR2018/053380
§ 371 (c)(1),
(2) Date: Jun. 11, 2020

(87) PCT Pub. No.: WO2019/122693
PCT Pub. Date: Jun. 27, 2019

(65) Prior Publication Data
US 2020/0408855 A1    Dec. 31, 2020

(30) Foreign Application Priority Data

Dec. 20, 2017   (FR) .......................... 1762656

(51) Int. Cl.
*G01R 33/032*    (2006.01)
*G01K 11/00*    (2006.01)
(Continued)

(52) U.S. Cl.
CPC ............ *G01R 33/032* (2013.01); *G01K 11/00* (2013.01); *G01R 15/245* (2013.01); *G01R 19/2513* (2013.01); *G01R 29/08* (2013.01)

(58) Field of Classification Search
CPC .......................... G01R 33/032; G01R 15/245; G01R 19/2513; G01R 29/08; G01R 15/246; G01K 11/00
(Continued)

(56) References Cited

U.S. PATENT DOCUMENTS 5,189,368 A    2/1993   Chase
5,264,697 A * 11/1993   Nakagawa .............. H01J 49/38
                                                                            250/281
(Continued)

FOREIGN PATENT DOCUMENTS

CN         206057424 U    3/2017
EP           0108012 A1    5/1984
(Continued)

OTHER PUBLICATIONS

Brian Culshaw et al., "Fiber-Optic Sensing: A Historical Perspective", Journal of Lightwave Technology, vol. 26, No. 9, May 1, 2008.

*Primary Examiner* — Giovanni Astacio-Oquendo
(74) *Attorney, Agent, or Firm* — Gable Gotwals (57) ABSTRACT

The present invention relates to a device (1) for measuring a magnetic field (B) and/or an electric field (E) comprising:—a measurement cell (3) enclosing a gas that is sensitive to the Zeeman effect and/or to the Stark effect, a polarised light source (7) the wavelength of which is tuned to an absorption line of the gas that is sensitive to the Zeeman effect and/or to the Stark effect,—at least one polarimetry system (11) configured to measure a first parameter corresponding to the rotation by a polarisation angle caused by the passage of the beam (9) through the measurement cell (3) enclosing a gas that is sensitive to the Zeeman effect and/or to the Stark effect,—a system (13) for measuring absorption, configured to measure a second parameter corresponding to the absorption of the beam (9) by the gas that is sensitive to the Zeeman effect and/or to the Stark (Continued)

effect in the measurement cell (3), and a processing unit (15) configured to combine the measurement of the first parameter corresponding to the rotation by the polarisation angle and the absorption measurement in order to extract therefrom a third and/or fourth parameter corresponding respectively to an electric field (E) and/or a magnetic field (B) to be measured.

16 Claims, 6 Drawing Sheets

(51) Int. Cl.
| | | |
|---|---|---|
| *G01R 15/24* | (2006.01) | |
| *G01R 19/25* | (2006.01) | |
| *G01R 29/08* | (2006.01) | |

(58) Field of Classification Search
USPC .................................... 324/244.1, 244, 200
See application file for complete search history.

(56) References Cited

U.S. PATENT DOCUMENTS

| | | | |
|---|---|---|---|
| 2012/0113423 A1 | 5/2012 | Groswasser | |
| 2013/0093421 A1* | 4/2013 | Ueno | G01R 33/032 |
| | | | 324/260 |
| 2015/0330786 A1 | 11/2015 | Bulatowicz et al. | |
| 2020/0098525 A1* | 3/2020 | Rosener | H01G 11/30 |

FOREIGN PATENT DOCUMENTS

| | | |
|---|---|---|
| EP | 0453693 A1 | 10/1991 |
| EP | 2626711 A1 | 8/2013 |

\* cited by examiner

DEVICE FOR MEASURING AN ELECTRIC AND/OR MAGNETIC FIELD IN PARTICULAR IN A CONDUCTOR FOR TRANSPORTING ELECTRICAL POWER

CROSS REFERENCE TO RELATED APPLICATIONS

This application is the United States National Phase of PCT Patent Application No. PCT/FR2018/053380 filed on 18 Dec. 2018. which claims priority to French Patent Application No. 1762656 filed 20 Dec. 2017, both of which are incorporated herein by reference.

The field of the present invention relates to the transportation of electricity in high-voltage alternating current (HVAC) and high-voltage direct current (HVDC) transport and distribution grids, and more particularly to an electrical energy transport cable of such a grid, and to an associated device for measuring an electric and/or magnetic field, or even a current and/or a voltage.

The current development of renewable energies is placing new constraints on the electricity grid, because the various locations where electricity is produced are generally far from each other and far from the consumption areas. It therefore appears necessary to develop new transport grids capable of transporting electricity over very long distances, while at the same time minimizing energy losses.

In order to meet these constraints, high-voltage (for example 50 kV) direct current (HVDC) grids appear to be a promising solution due to lower line losses than alternating current grids and the lack of occurrence of stray capacitances in the grid over long distances.

In order to control the electrical energy transport grid, the voltage and/or the current are measured at suitable locations on power lines or substations.

To this end, inductive transformers formed of a winding surrounding the electrical conductor/electrical energy transport cable and operating on the principle of electromagnetic induction are known, for example.

However, such known devices do not allow measurements on direct current electrical energy transport cables.

Another defect with known devices is linked to the weight of the winding surrounding the electrical conductor/electrical energy transport cable, notably when the latter is arranged at a height. Specifically, in this case, the weight of the winding may cause significant mechanical stresses on the supports of the measurement device.

More recently, further measurement methods have been developed in order to overcome the above mentioned defects.

EP 0453693 relates to a "Pockels-effect electric field sensor". This sensor has a crystal intended to be flowed through by a polarized monochromatic light beam in order to determine the value of an electric field and its direction.

The Pockels effect is the occurrence of birefringence in an environment created by a static or variable electric field. The birefringence that occurs is proportional to the electric field, which is therefore able to be measured.

The sensor in EP0453693 comprises in particular a light source intended to generate a monochromatic light beam, a probe crystal and a photodetector of photodiode type, for example. The light source is connected to the probe crystal by a single-mode optical fiber and the probe crystal is connected to the detector by a polarization-maintaining optical fiber.

The probe crystal that is used has a particular birefringent crystallographic structure when subjected to an electric field, such that, by measuring the phase difference between the two components of the polarization of the beam that passed through the probe crystal, it is possible to measure the electric field.

However, the probe crystal that is used is sensitive to temperature variations, thereby making it difficult to use in an energy transport grid that is subject to climatic variations. In addition, it is then necessary to use a temperature sensor and a compensation unit in order to correct the effect of temperature variations on the measurements.

Another effect that may be utilized to measure for example a current is the Faraday effect. The Faraday effect results from the interaction between light and a magnetic field in a material. Specifically, the polarization of the light brings about a rotation proportional to the component of the magnetic field in the direction of propagation of the light. Since this component of the magnetic field is proportional to the current in the electrical conductor/energy transport cable, it is then possible to measure the current by measuring the rotation of the polarization.

One example of such a measurement device is described in EP0108012.

The device described in that document has an optical fiber wound around the electrical conductor and through which a monochromatic light beam generated by a light source, such as for example a laser diode, passes. On the other hand, the device described there has a device for analyzing the light polarization at the output of the optical fiber. The analysis device comprises a polarizer splitter cube, two photodiodes each detecting intensities of linearly and orthogonally polarized light beams, and an analog unit calculating the representative ratio of the intensity to be measured in the electrical conductor/electrical energy transport cable.

In this case too, it is possible to observe a dependency of the Faraday effect with respect to the temperature, thereby requiring subsequent correction of the measurement result.

CN206057424 utilizes yet another effect: the Hall effect. This document discloses a current measurement device comprising a Hall-effect detector and a temperature detection unit in order to make corrections to the measurements taken on the basis of the temperature of the Hall-effect detector. The device described there also comprises a microprocessor intended to process and correct the voltage data measured by the Hall-effect detector. That document specifies that the current flowing through the electrical conductor/electrical energy transport cable generates a proportional magnetic field, making it possible to detect the intensity and the voltage of the current flowing in the electrical conductor/electrical energy transport cable.

The aim of the present invention is to propose a device for measuring an electric or magnetic field that is able to overcome temperature variations and that is able to be robust enough to be able to be installed in locations that are subject to significant climatic variations.

To this end, the present invention relates to a device for measuring a magnetic field and/or an electric field, comprising:
  a measurement cell containing a gas sensitive to the Zeeman effect and/or to the Stark effect, in particular an alkaline gas, and intended to be arranged in a magnetic field and/or electric field,
  a polarized light source whose wavelength is tuned to an absorption line of the gas sensitive to the Zeeman effect and/or to the Stark effect and that emits a light beam passing through said measurement cell,
  at least one polarimetry system configured so as to measure a first parameter corresponding to the rotation of a polarization angle due to the beam passing into the measurement cell containing a gas sensitive to the Zeeman effect and/or to the Stark effect, an absorption measurement system configured so as to measure a second parameter corresponding to the absorption of the beam by the gas sensitive to the Zeeman effect and/or the Stark effect in the measurement cell, and a processing unit configured so as to combine the measurement of the first parameter corresponding to the rotation of the polarization angle and the absorption measurement in order to extract therefrom a third and/or fourth parameter corresponding to an electric field and/or magnetic field to be measured, respectively.

The invention may furthermore comprise one or more of the following aspects, taken alone or in combination:

According to one aspect, the alkaline gas is for example rubidium, lithium, sodium, potassium, caesium or francium.

The device may comprise a measurement head comprising a beam splitter (a splitter plate or a beam-splitter cube) for splitting light from the polarized light source into at least two partial light beams and reflectors for defining two measurement branches perpendicular to one another, the measurement cell being arranged in the measurement head at the intersection of the two partial beams.

The measurement head is for example connected to the polarized light source, the polarimetry system and the absorption measurement system by optical fibers.

According to another aspect, the path of the light beam passing through the measurement cell has at least one component collinear with the magnetic field or electric field to be measured or is collinear with the magnetic field or electric field to be measured.

The measurement cell may be a cube having a first side of a length between 0.1 mm and 20 mm and a second side of a length between 0.1 mm and 25 mm or a cylinder of a height between 0.1 mm and 20 mm and a diameter between 0.1 mm and 25 mm.

The polarimetry system is notably a balanced polarimetry system arranged downstream of the measurement cell and comprising a polarizing beam splitter as well as two associated photodetectors.

The absorption measurement system comprises for example a first and a second beam splitter plate arranged respectively upstream and downstream of the measurement cell, and two photodetectors associated with each of the beam splitter plates and configured so as to detect the luminous intensity of the light beam upstream and downstream of the measurement cell.

The light source is in particular a laser, notably a laser diode.

It is possible to provide a single laser light source that is used to measure both at least one electric field and at least one magnetic field.

The invention additionally relates to a unit for measuring a current and/or a voltage in a medium-voltage or high-voltage electrical conductor, comprising at least one measurement device as defined above, and in that the processing unit is furthermore configured so as to determine a voltage relative to ground and/or an electric current flowing in the conductor on the basis of the distance between the electrical conductor and the measurement cell.

The invention furthermore relates to a gas-insulated substation comprising a metal casing enclosing a medium-voltage or high-voltage electrical conductor, wherein it comprises a measurement device as defined above, the measurement cell of which is arranged inside the substation, notably fixed to the inner part of the metal casing.

Other features and advantages of the invention will become apparent from the following description, given by way of example and without limitation, with reference to the appended drawings, in which.

In all of the figures, elements having identical functions bear the same reference numerals.

The following embodiments are examples. Although the description refers to one or more embodiments, this does not necessarily mean that each reference relates to the same embodiment, or that the features apply only to a single embodiment. Individual features of various embodiments may also be combined or interchanged to provide other embodiments.

"Upstream" or "downstream" denotes where the elements are located in the direction of propagation of light. Thus, a first apparatus or element is located upstream of a second apparatus or element if the light beam passes firstly through the first and then through the second apparatus.

In this disclosure, some references may be supplemented by a letter denoting the nature of the field to be measured. For example, a photodetector 19 may become a photodetector 19E when it is involved in measuring an electric field, and 19B in the case of a magnetic field. A measurement head 33 may become a measurement head 33E when it is involved in measuring an electric field, and 33B in 30 the case of a magnetic field, or 33EB if it is involved in measuring both a magnetic field B and an electric field E.

The present invention relates to any medium-voltage or high-voltage alternating current or direct current installation, and notably electrical conductors/electrical energy transport cables or for example gas-insulated substations.

The present invention is applied to particular benefit in a high-voltage direct current (HVDC) grid for transporting electrical energy, that is to say current.

Figure 1:
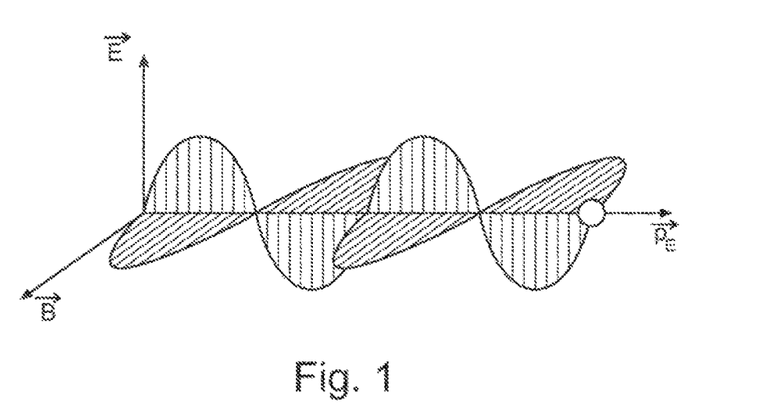
FIG. 1 shows an illustrative diagram relating to the polarization of light.

FIG. 1 shows an illustrative diagram relating to the polarization of light. A light wave is an electromagnetic wave whose electric field $\vec{E}$ and magnetic field t form a direct trihedron with the direction of propagation $\vec{p_E}$ of this wave. This electric field evolves during the propagation of this wave while describing a specific shape if it is observed facing the wave. The polarization of the wave (direction of the electric field) during its propagation may thus be classified into 3 categories: rectilinear polarization, circular polarization and elliptical polarization.

The Zeeman effect (for the magnetic field B) and the Stark effect (for the electric field E) are effects that occur on the electron energy levels of atoms (including alkali). These effects may be observed provided that it is possible to interact with these energy levels. One way to interact with these levels is to use the interaction of the electron spins of the atoms in question with photons from resonant light radiation, for example a laser, with the energy level to be interrogated.

The Zeeman effect or the Stark effect will then be observable using a linearly polarized light wave interacting with the energy levels involved. This observation is made by monitoring the rotation of linear polarization of the light wave.

These effects may be observed particularly well for example in gases formed from atoms with a single valence electron, such as for example alkali atoms. Alkalis are widely used in many applications due to the single valence electron having a mismatched spin that is easily able to be manipulated. It is thus possible to approximate the energy of the atom through the energy of the single electron on the valence band.

However, when a gaseous medium is involved, these two Stark and Zeeman effects depend on the density of the medium through which light passes and therefore also on the temperature.

Figure 2:
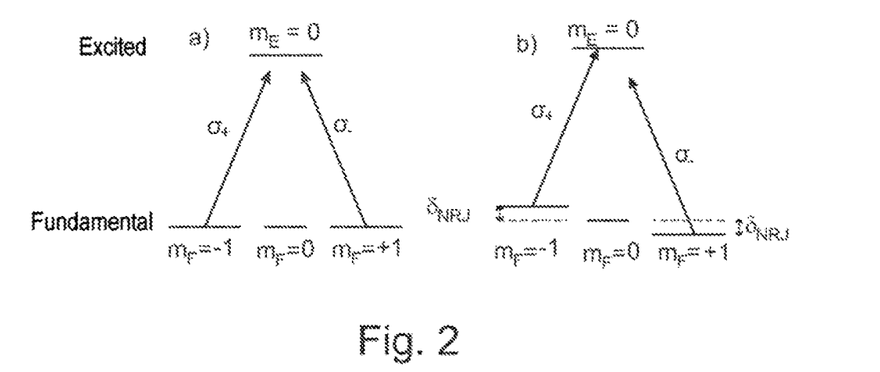
FIG. 2 shows two simplified diagrams modelling energy levels of an alkali atom, specifically for part a) in the absence of any electromagnetic field and for part b) in the presence of a magnetic field or electric field parallel to the direction of propagation of a light beam.

Part a) of FIG. 2 shows a simplified diagram modelling energy levels of an alkali atom in the absence of any electromagnetic field.

This is therefore a simplified three-level energy system (the fundamental sub-level $m_F=0$ is not involved in the atom-laser interaction process that will be described).

This system has a fundamental level that is formed of three fundamental sub-levels of momentum $m_F=-1$, $m_F=0$, and $m_F=+1$. This system also has an excited level without sub-levels of momentum $m_E=0$.

When a linearly polarized light wave with a given direction of propagation propagates, it is possible to break this linear polarization down into the sum of two circular polarizations of opposite direction $\sigma_+$ and $\sigma_-$.

The light wave will thus interact with the two fundamental sub-levels of momentum $m_F=-1$ and $m_F=+1$ in order to put the electron on the excited level of momentum $m_E=0$. This is explained through a selection rule relating to the conservation of angular momentum and the fact that the wave $\sigma_+$ exchanges a photon of momentum $+1$ and the wave $\sigma_-$ exchanges a photon of momentum $-1$.

Part b) of FIG. 2 shows a simplified diagram modelling energy levels of an alkali atom in the presence of a magnetic field $\vec{B}$ or electric field E parallel to the direction of propagation $\vec{p_E}$ of a light beam.

Applying an electric field $\vec{E}$ or magnetic field $\vec{B}$ collinear with the direction of propagation of the light wave $\vec{p_E}$ causes an energy displacement of the fundamental sub-levels of momentum $m_F=-1$ and $m_F=+1$ (positive for one and negative for the other, and vice versa in the case of a field of opposite direction).

In the case of an electric field, this effect is called the Stark effect and the value of this energy offset $\delta_{NRJ}{}^{\vec{E}}$ has the value:

$$\delta_{NRJ}{}^{\vec{E}} = |\vec{\mu} \cdot \vec{p_E}||\vec{E} \cdot \vec{p_E}|^2 \qquad \text{eq. (1)}$$

where $\vec{\mu}$ is the dipole moment of the alkali atom.

In the case of a magnetic field $\vec{B}$, this effect is called the Zeeman effect and the value of the energy offset $\delta_{NRJ}{}^{\vec{B}}$ then has the value:

$$\delta_{NRJ}{}^{\vec{B}} = |\vec{\mu_B} \cdot \vec{B}| \qquad (2)$$

where $\vec{\mu_B}$ is the Bohr magneton.

There is an energy difference of $2\delta_{NRJ}{}^{\vec{E}}$ in the case of applying an electric field and $2\delta_{NRJ}{}^{\vec{B}}$ in the case of applying a magnetic field between the 2 fundamental sub-levels of momentum $m_F=-1$ and $m_F=+1$, as may be seen in FIG. 2b. This therefore generates a difference between the interaction of the component $\sigma_+$ and the component $\sigma_-$ with the electrons of the alkali atom under consideration.

After mathematical reconstruction of the polarization of the light wave, the linear polarization of the light wave that passed through an alkali atom medium of length $\ell$ is rotated by an angle $\theta$ of:

$$\theta_{\vec{E}} = \psi_{\vec{E}} \cdot n_{al} \cdot \ell \cdot E^2 \qquad \text{eq. (3)}$$

$$\theta_{\vec{B}} = \psi_{\vec{B}} \cdot n_{al} \cdot \ell \cdot B \qquad \text{eq. (4)}$$

where $\psi_{\vec{E}}$ is the parameter of interaction between light and matter in the presence of an electric field, E is the component of the electric field along the axis of propagation of the light wave $\vec{p_E}$, $\psi_{\vec{B}}$ is the parameter of interaction between light and matter in the presence of a magnetic field, B is the component of the magnetic field along the axis of propagation of the light wave $\vec{p_E}$, $n_{al}$ is the volume density of alkali, which is a temperature-dependent. parameter.

It is therefore understood that detecting the rotation of the polarization of the light wave through polarimetry makes it possible, when the volume density is known or when it is fixed, to measure an electric field and/or a magnetic field.

The density of alkaline gas present in a measurement cell is dependent on the temperature (saturation vapor pressure). In order to overcome this problem, it is proposed to use the phenomenon of absorption of the light beam by the alkaline gas. Specifically, the power $P_T$ of the light beam at the output of a measurement cell as a function of the input power $P_0$ (is given by the relationship:

$$P_T = P_0 e^{-\psi_{Abs} \cdot n_{al} \cdot \ell} \qquad \text{eq. (5)}$$

where $\psi_{Abs}$ is the known parameter of interaction between light and matter due to absorption. This then gives:

$$\ln\left(\frac{P_0}{P_T}\right) = \psi_{Abs} \cdot n_{al} \cdot \ell \qquad \text{eq. (6)}$$

By isolating $n_{al}$ in this formula:

$$n_{al} = \ln\left(\frac{P_0}{P_T}\right)\frac{1}{\ell \psi_{Abs}} \qquad \text{eq. (7)}$$

And by using equation (7) in equations (3) and (4) above, it is therefore possible to overcome the effect of temperature.

$$\theta_E = \ln\left(\frac{P_0}{P_T}\right)\frac{\psi_E}{\psi_{Abs}} \cdot E^2 \qquad \text{eq. (8)}$$

$$\theta_B = \ln\left(\frac{P_0}{P_T}\right)\frac{\psi_B}{\psi_{Abs}} \cdot B \qquad \text{eq. (9)}$$

Figure 3:
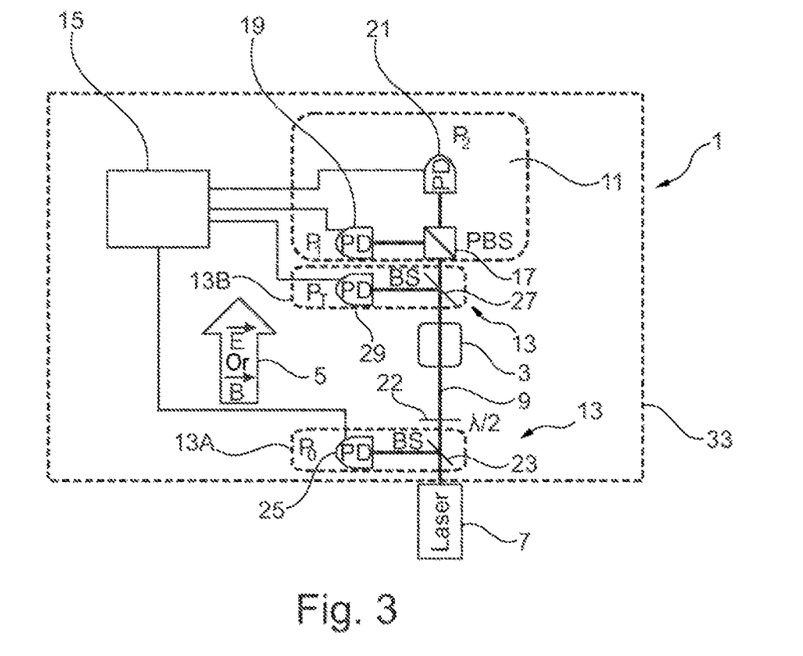
FIG. 3 shows a simplified diagram of a measurement device according to a first embodiment.

FIG. 3 shows an example of a simplified diagram of a measurement device 1 according to a first embodiment combining both polarimetry and absorption measurement in order to achieve either a measurement of the magnetic field or a measurement of the electric field, as the case may be, if the propagation of the light beam is collinear with the magnetic field or electric field.

The measurement device 1 for measuring a magnetic field and/or an electric field comprises
  a measurement cell 3 containing a gas sensitive to the Zeeman effect and/or to the Stark effect, in particular an alkaline gas, and intended to be arranged in a magnetic field and/or electric field indicated by the arrow 5,
  a polarized light source 7 whose wavelength is tuned to an absorption line of the gas sensitive to the Zeeman effect and/or to the Stark effect contained in the measurement cell 3 and that emits a light beam 9 passing through said measurement cell 3,
  a polarimetry system 11 configured so as to measure a first parameter corresponding to the rotation of a polarization angle due to the beam passing through the gas sensitive to the Zeeman effect and/or to the Stark effect in the measurement cell 3,
  an absorption measurement system 13 configured so as to measure a second parameter corresponding to the absorption of the beam 9 by the gas sensitive to the Zeeman effect and to the Stark effect in the measurement cell 3, and
  a processing unit 15 configured so as to combine the measurement of the first parameter corresponding to the rotation of the polarization angle and the absorption measurement in order to extract therefrom a third and/or fourth parameter corresponding to an electric field E and/or magnetic field B to be measured, respectively.

The gas sensitive to the Zeeman effect and/or to the Stark effect contained in the measurement cell 3 is therefore in particular an alkaline gas, for example formed of rubidium, lithium, sodium, potassium, caesium or francium atoms.

The measurement cell 3 is in particular transparent to the wavelength of the light source 7 that is used. It is enough for only the faces through which the light beam 9 passes to be transparent. The other surfaces may be opaque, which may be advantageous for eliminating possible interference caused by ambient light.

The measurement cell 3 is for example a cube/parallelepiped having a first side of a length between 0.1 mm and 20 mm and a second side of a length between 0.1 mm and 25 mm or a cylinder of a height between 0.1 mm and 20 mm and a diameter between 0.1 mm and 25 mm. It therefore has dimensions that are small enough to be able to be installed in any suitable location in an electrical energy transport installation, or even, as will be described further on, for integrating it into the apparatus of this installation. In addition, a small cell allows the measurement range to be adapted while at the same time impacting sensitivity.

The light source 7 is for example a laser, notably a laser diode. The wavelength of the laser is chosen on the basis of the absorption transition of the chosen alkali.

The following table gives examples of wavelengths for a given alkali and a given transition.

| Alkali | Wavelength $\lambda_{D1}$ (nm) | Wavelength $\lambda_{D2}$ (nm) |
|---|---|---|
| $^{39}$K = Potassium 39 | 770.108 | 766.701 |
| $^{40}$K = Potassium 40 | | |
| $^{41}$K = Potassium 41 | | |
| $^{85}$Rb = Rubidium 85 | 794.979 | 780.241 |
| $^{87}$Rb = Rubidium 87 | | |
| Cs = Cesium | 894.593 | 852.347 |

The polarimetry system 11 may in particular be a balanced polarimetry system (see in particular FIGS. 3, 5 and 6) that is arranged downstream of the 30 measurement cell 3. Such a polarimetry system 11 notably comprises a polarizing beam splitter 17 as well as two associated photodetectors 19 and 21.

The polarizing beam splitter 17 (PBS in the figures) splits the polarization components s and p in order to send them respectively to the photodetectors 19 and 21 (PD in the figures), for example photodiodes. For example, the polarization component s is reflected at 90° toward the photodetector 19, whereas the component p passes through the polarizing beam splitter 17 in order to be detected by the photodetector 21.

Thus, taking into account the measurement signals of the photodetectors 19 and 21, it is possible to measure the polarization angle of the light beam at the output of the measurement cell 3 and it is possible to determine, knowing the starting linear polarization at the output of the light source 7, the variation in the polarization angle, which makes it possible to determine the value of the electric and/or magnetic field to be measured.

For the sake of simplifying the explanation and without restriction, the situation is assumed in which the input polarization in the measurement cell is at 45° with respect to the component s or p of the polarizing beam splitter 17.

This then gives the output signal for the electric field $\vec{E}$ and for the magnetic field $\vec{B}$, respectively of component E for the electric field and of component B for the magnetic field along the axis of propagation of the laser, which is given by:

$$\theta_E = \alpha_{Att} \cdot \frac{P_1 - P_2}{P_0} = \psi_E \cdot n_{al} \cdot \ell \cdot E^2 \qquad \text{eq. (10)}$$

$$\theta_B = \alpha_{Att} \cdot \frac{P_1 - P_2}{P_0} = \psi_B \cdot n_{al} \cdot \ell \cdot B \qquad \text{eq. (11)}$$

Where
E=component of the electric field E collinear with the direction of propagation of the light beam 9,
B=component of the magnetic field B collinear with the direction of propagation of the light beam 9, $\alpha_{Att}$ the known or predetermined attenuation coefficient of the light beam, $P_1$ the light intensity measured by the photodetector 19, $P_2$ the light intensity measured by the photodetector 21, $P_0$ the light intensity measured by the photodetector 25.

Of course, it is assumed in our case that $\vec{E} \perp \vec{B}$, that is to say that the light beam is oriented so as to be sensitive to only one of the two electric or magnetic fields.

In order to be able to adjust the linear polarization of the light beam 9 with respect to the polarizing beam splitter 17, a half-wave plate 22 (also denoted $\lambda/2$ in the figures) is arranged upstream of the measurement cell 3.

The absorption measurement system 13 will be used to overcome the dependency on the temperature. It comprises an upstream part 13A and a downstream part 13B. In more detail, the upstream part 13A comprises a first beam splitter plate 23 ("beam splitter"—BS in the figures) arranged upstream of the measurement cell 3 and an associated photodetector 25 that are configured so as to 40 detect the luminous intensity of the light beam 9 upstream of the measurement cell 3. The downstream part 13B comprises a second beam splitter plate 27 arranged downstream of the measurement cell 3, but upstream of the polarimetry system 11, and an associated photodetector 29 that are configured so as to detect the luminous intensity of the light beam 9 downstream of the measurement cell 3. The splitter plates 23 and 27 may be replaced with splitter cubes.

This temperature-dependent signal may then be corrected with the absorption signal as defined above. The output signal for the electric field of equation (10) or for the magnetic field of equation (11) then becomes:

$$S_E = \frac{\theta_E}{\ln\left(\frac{P_0}{P_T}\right)} = \frac{\psi_E}{\psi_{Abs}} \cdot E^2 \qquad \text{eq. (12)}$$

$$S_B = \frac{\theta_B}{\ln\left(\frac{P_0}{P_T}\right)} = \frac{\psi_B}{\psi_{Abs}} \cdot B \qquad \text{eq. (13)}$$

A temperature-independent signal is thus obtained, allowing the electric field or the magnetic field to be measured. In order to return to the absolute value of the field E or B to be measured, it is for example possible to use calibration to determine the correspondence between the measured signal S and the value of the field E or B.

In order then to return to the electric current flowing in an electrical conductor or the voltage relative to ground, it is necessary to take into account the distance between the measurement cell 3 and the electrical conductor.

Given that the alkali atoms are confined to within the measurement cell, the absorption rate is ultimately only dependent on the temperature. Using the signal of $P_T$ on the photodetector 29 thus also allows a local measurement of the temperature. Specifically, the alkali density $n_{al}$ is dependent on the temperature T in Kelvin, given by the following relationship:

$$n_{al}(T) = \ln\left(\frac{P_0}{P_T}\right)\frac{1}{\ell\psi_{Abs}} = \frac{10^{18,9848+a-\frac{b}{T}}}{T} \qquad \text{eq. (14)}$$

where a and b are parameters specific to each alkali.

Using a mathematical calculation taking into account the signal $P_T/P_0$, it is therefore possible to measure the local temperature at the same time as measuring the electric or magnetic field.

In FIG. 3, the light source 7 is supplied directly to the optoelectronic assembly, which may also be called a measurement head 33.

According to one variant, the light source 7, that is to say for example a laser, is for example remote from the measurement head 33, the two being connected to one another by an optical fiber.

Figure 4A:
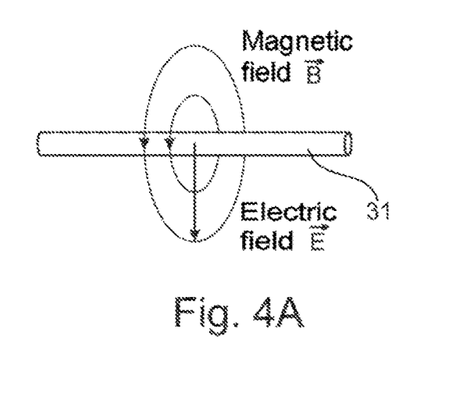
FIG. 4A is an explanatory diagram of the electric and magnetic fields formed around a current conductor.

FIG. 4A is an explanatory diagram of the electric field $\vec{E}$ and magnetic field $\vec{B}$ formed around a current conductor 31, The magnetic field $\vec{B}$ is circular around the conductor 31, whereas the electric field $\vec{E}$ points in a radial direction perpendicular to the magnetic field $\vec{B}$.

Figure 4B:
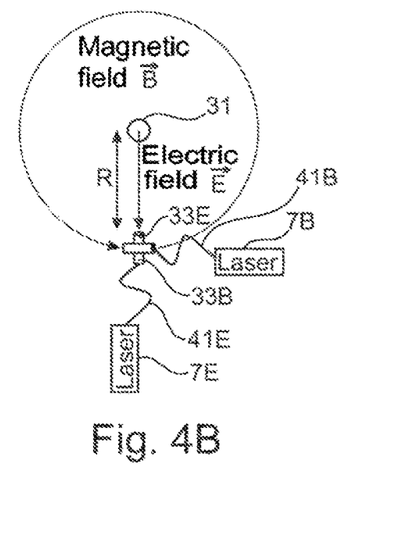
FIG. 4B is a simplified diagram showing two measurement devices arranged around an electric current conductor for measuring both the magnetic field and the electric field at a predetermined distance from the conductor.

FIG. 4B is a simplified diagram showing the same electrical conductor 31 in cross section and the electric field $\vec{E}$ and magnetic field $\vec{B}$ formed around an electric current conductor 31. Also indicated schematically are two electric (E) and magnetic (B) measurement heads 33E, 33B of two measurement devices 1 arranged around the electric current conductor 31 for measuring both the magnetic field and the electric field at a predetermined distance R from the electrical conductor 31. In this 10 exemplary embodiment, the light sources 7E and 7B are connected to the respective measurement heads 33E, 33B by optical fibers 41, that is to say 41E between the light source 7E and the measurement head 33E and 41B between the light source 7B and the measurement head 33B.

As may be seen by the longitudinal orientation of the measurement heads 33E and 33B shown schematically in FIG. 4B, the light beam of the measurement head 33E is partly passing through the measurement cell 3 collinear with the electric field $\vec{E}$ and the light beam of the measurement head 336 is partly passing through the measurement cell 3 collinear with the magnetic field $\vec{B}$.

In this configuration, the electric current I flowing in the electrical conductor 31 is given by the relationship:

$$I = \frac{2\pi RB}{\mu_0} \qquad \text{eq. (15)}$$

Where $\mu_0$ is the magnetic permeability of free space.

Similarly, the voltage of the electrical conductor 31 is obtained relative to ground.

The relationship between the measured electric field E and the voltage applied to the current conductor 31 $V_0$ is given by the following relationship:

$$V_0 = r \ln\left(\frac{r_0}{r}\right) E_0 \qquad \text{(eq. 16)}$$

of course, by performing calibration with an electrical conductor 31 in which 30 a known current is flowing, it is possible to calibrate the measurement device 1 and to correlate the measured signals and the parameter to be measured (electric or magnetic field).

Figure 5:
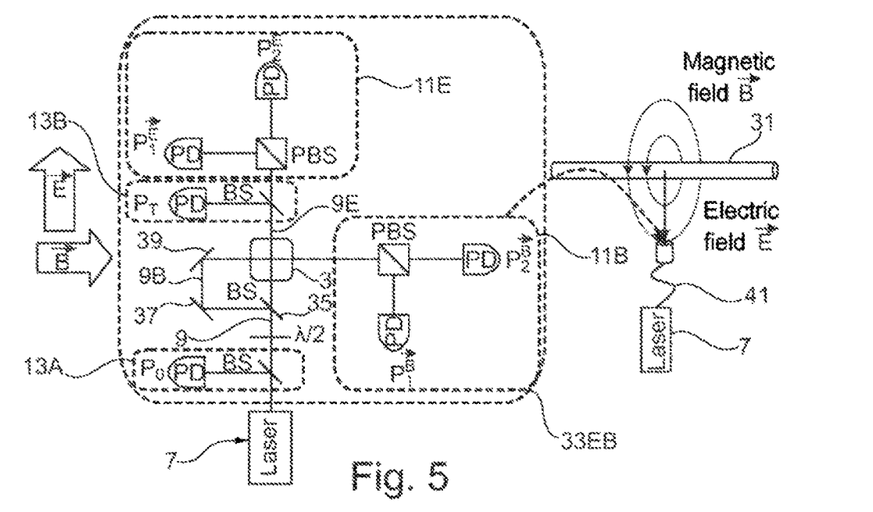
FIG. 5 is a simplified and optimized variant of the embodiment of FIG. 4B.

FIG. 5 is a simplified and optimized variant of the embodiment of FIG. 4B combining the measurement heads 33E and 33B into a single measurement head 33EB. In this case, the measurement head 33EB comprises a splitter plate 35 for splitting the light beam 9 from the polarized light source 7 into two partial light beams 9E and 9B, reflectors for defining two measurement branches perpendicular to one another, the measurement cell 3 being arranged in the measurement head at the intersection of the two partial beams 9E and 9B.

In this assembly, the assembly shown in FIG. 3 with a polarimetry system 11E has therefore been supplemented with the splitter plate 35 and two reflectors 37 and 39 for directing the light beam 9B into the measurement cell 3 with the light beam 9B intersecting perpendicular to the light beam 9E. At the output of the measurement cell 3, the beam 9B is directed to a polarimetry system 11B.

As indicated in FIG. 5, the polarized light beam 9 may be routed to the measurement head 33EB either directly or via an optical fiber 41.

Figure 6:
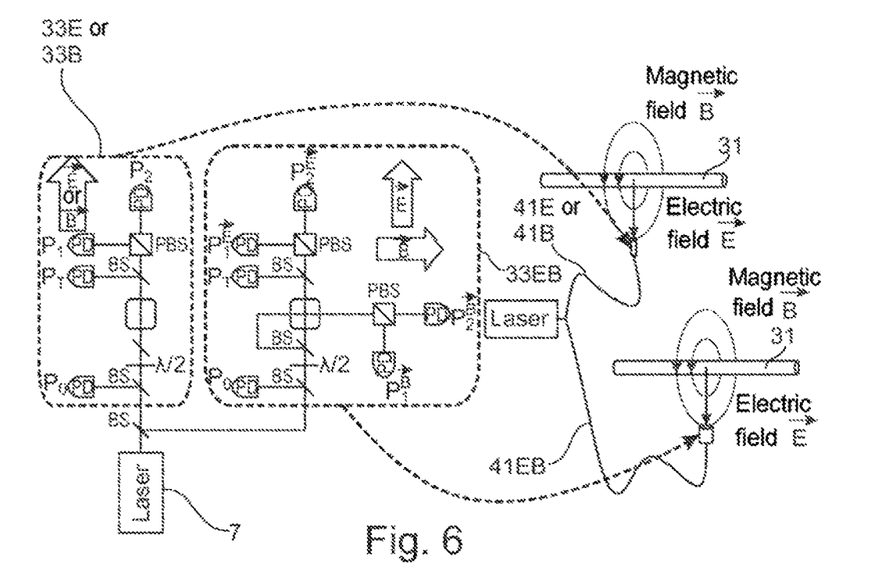
FIG. 6 is an exemplary embodiment of a measurement device for measuring electric and/or magnetic fields close to several electrical conductors.

FIG. 6 is an exemplary embodiment of a measurement device 1 for measuring electric and/or magnetic fields close to several electrical conductors 31. In this case, the measurement heads 33, here 33E or B as well as 33EB, may be supplied by the polarized light beam 9 from a single laser 7. In this example, a measurement head 33E or B is identical to that of FIG. 3 with an orientation of the light beam 9 collinear with the electric field, and another measurement head 33EB is identical to that of FIG. 5 in order to measure both the electric and magnetic fields of an electrical conductor 31.

Figure 7:
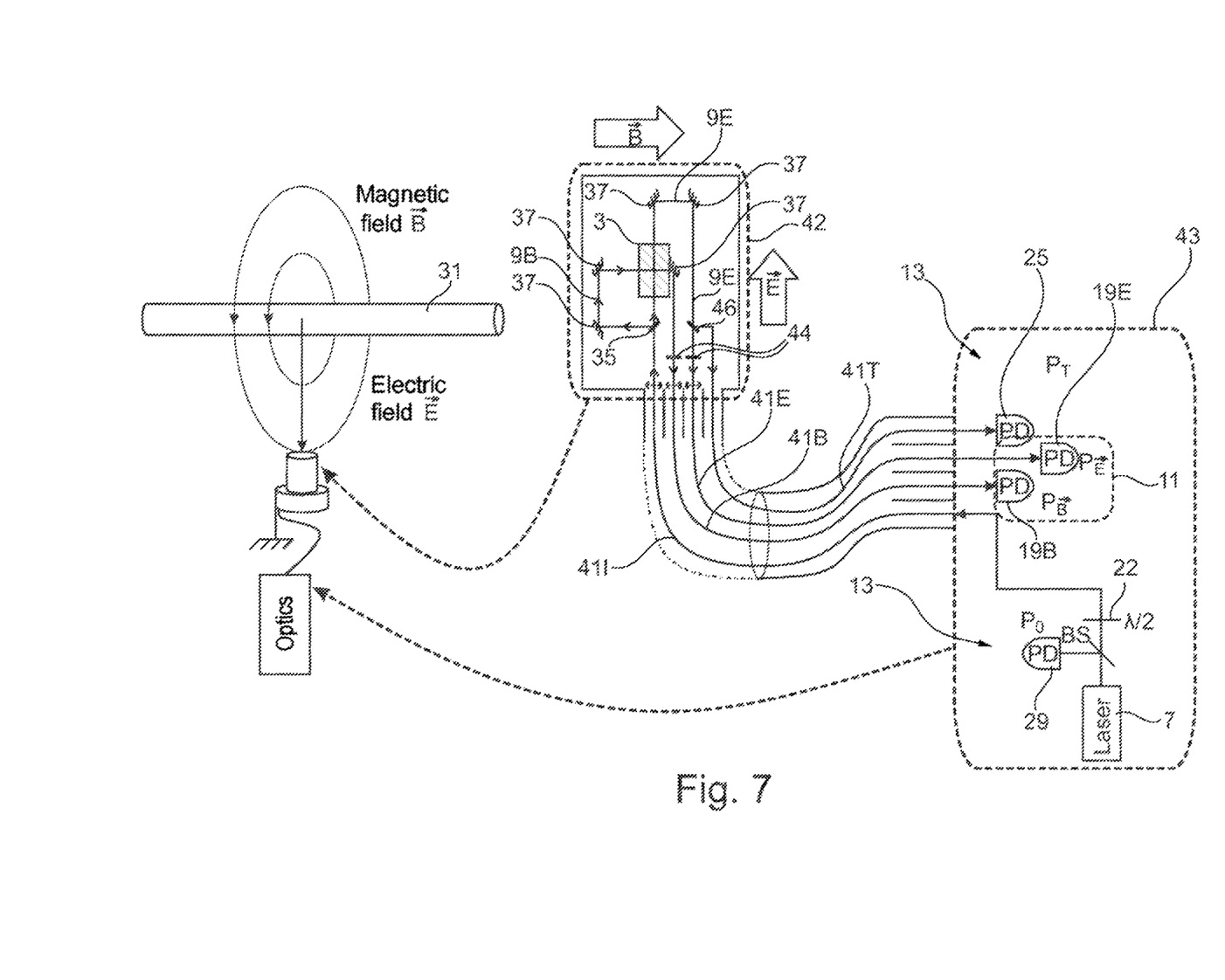
FIG. 7 is a simplified diagram of a second embodiment with a measurement head, on the one hand, and a measurement base, on the other hand, connected to one another by optical fibers.

FIG. 7 is a simplified diagram of a second embodiment in which, for the measurement head portion 33EB, the optical/placement functions of the measurement cell 3 and the measurement functions with the optronic components, comprising in particular the photodetectors, are separated.

The measurement head 33 is thus divided into a probe head 42 and a measurement base 43.

The probe head 42 comprises the measurement cell 3 at its center. It is furthermore connected to an input optical fiber 41I that is connected to the light source 7 and an output optical fiber 41E for routing the partial light beam 9E that passed through the measurement cell 3 while being collinear with the electric field E to a corresponding input of the measurement base 43, an output optical fiber 41B for routing the partial light beam 9B that passed through the measurement cell 3 while being collinear with the magnetic field B to a corresponding input of the measurement base 43 and an output optical fiber 41T for routing the partial light beam 9E that passed through the measurement cell 3 in order to be routed to a photodetector 25 for the absorption measurement.

The input optical fiber 41I is a polarization-maintaining fiber. The output optical fibers 41E, 41B, 41T are non-polarization-maintaining fibers (but the use of polarization-maintaining optical fibers is also possible, but not imperative). The probe head 42 therefore only contains, in addition to the measurement cell 41, reflectors 37, a splitter plate 35 arranged upstream of the measurement cell 3, two polarizers 44 for example in the form of a plate or a cube, arranged downstream of the measurement cell 3 in the partial light beams 9E and 96 and a splitter plate 46 arranged downstream of the measurement cell 3 and upstream of one of the polarizer plates 44, in the present example in particular in the partial beam 9E. For mathematical reasons, the axis of the polarizers 44 is set at 45° with respect to the input polarization of the cell 3.

The light source 7, two polarimetry systems 11E and 11B and the absorption measurement system 13 are installed in the measurement base 43. This configuration makes it possible to place in particular photodetectors 19E, 19B, 25, 29 further from the electrical conductor 31, for example a few meters or tens of meters away, or even more. The photodetectors 19E, 19B, 25, 29 may thus be placed further from the electrical conductor 31 in order to better overcome potential electromagnetic interference that may be generated by the electric and magnetic fields of the electrical conductor 31 on the measurement sensors.

According to one variant, the measurement base 43 is installed and integrated in a metal housing serving as a Faraday cage.

Figure 8:
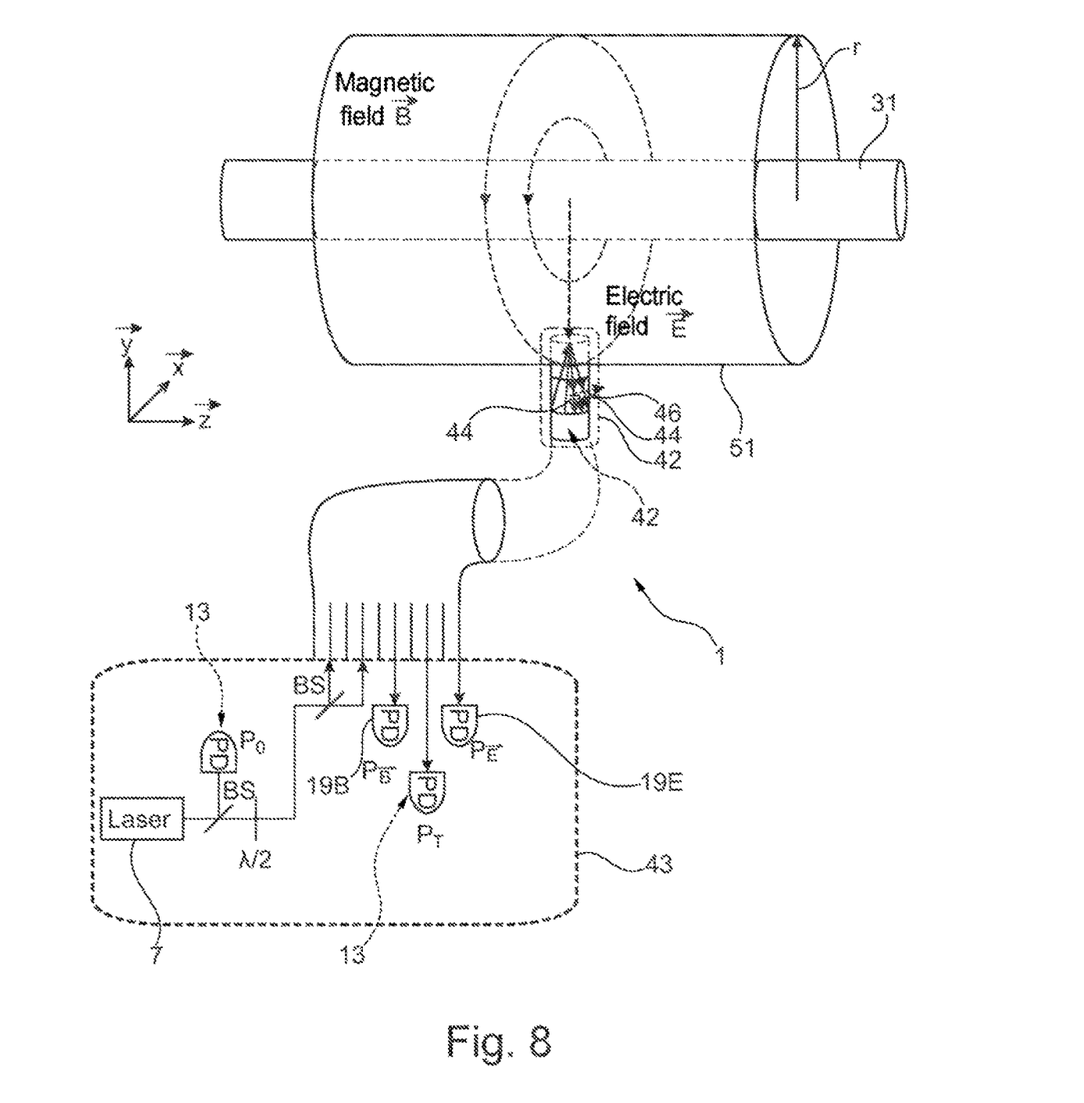
FIG. 8 is a simplified diagram of a gas-insulated substation comprising a measurement device according to a third embodiment.

FIG. 8 is a simplified and partial diagram of a gas-insulated substation 51 enclosing a medium-voltage or high-voltage electrical conductor 31 and comprising a measurement device 1 with a measurement base 43 highly similar to that of FIG. 7, with the difference that the splitting into two partial beams 9E and 9B by the splitter plate 35 takes place in the measurement base 43 such that four optical fibers 41 are connected to the probe head 42.

For FIGS. 7 and 8, the optical fibers (for example 41I) upstream of the probe head 42 are therefore polarization-maintaining fibers. The half-wave plate $\lambda/2$ 22 used upstream of the probe head allows the polarization to be adjusted in order to inject the beam from the light source 7 into the polarization-maintaining fiber(s) along a preferred axis of the fiber.

The optical fibers 41E, 41B, 41T used for the beams downstream of the probe head 42 are for example non-polarization-maintaining fibers (but the use of polarization-maintaining optical fibers is also possible, but not imperative). The splitter plate 46 added in the probe head 42 makes it possible to obtain the absorption (and therefore temperature) information using the additional fiber 41T.

On the side of the measurement base 43, the three photodetectors 19E, 19B and 25 make it possible to analyze the signals. The photodetector 25 makes it possible to measure the absorption, whereas the photodetectors 19E and 19B make it possible to measure the angle of rotation and therefore the fields to be measured using the following equations:

$$\theta_E = \alpha_{att} \cdot \frac{1}{2} \cdot \sin^{-1}\left(\frac{2P_E}{P_0} - 1\right) = \psi_E \cdot n_{al} \cdot \ell \cdot E^2$$

$$\theta_B = \alpha_{att} \cdot \frac{1}{2} \cdot \sin^{-1}\left(\frac{2P_B}{P_0} - 1\right) = \psi_B \cdot n_{al} \cdot \ell \cdot B$$

Where
E=component of the electric field E collinear with the direction of propagation of the light beam 9,
B=component of the magnetic field B collinear with the direction of propagation of the light beam 9,
$\alpha_{att}$ the known or predetermined attenuation coefficient of the light beam,
$P_{\vec{E}}$ the light intensity measured by the photodetector,
$P_{\vec{B}}$ the light intensity measured by the photodetector,
$P_0$ the light intensity measured by the photodetector.

It is understood that the embodiment of FIGS. 7 and 8 comprises a simplified polarimetry system with a polarizer 44 arranged downstream of the measurement cell 3 and an associated photodetector 19E, 19B for each branch. In this case, the beam at the input of the measurement cell 3 is linearly polarized either because of the light source 7 or by placing for example a polarizer upstream of the measurement cell 3.

The absorption measurement system 13 comprises for example a beam splitter 46 (for example a splitter plate or a splitter cube) that is arranged downstream of the measurement cell 3 and upstream of a polarizer 44 (for example in the form of a plate or a cube) in order to direct part of the beam to a photodetector 25 of the absorption measurement system 13.

Of course, this simplified version may be contemplated without optical fibers. In this case, the use of a balanced polarimetry system may also be contemplated.

Figure 9:
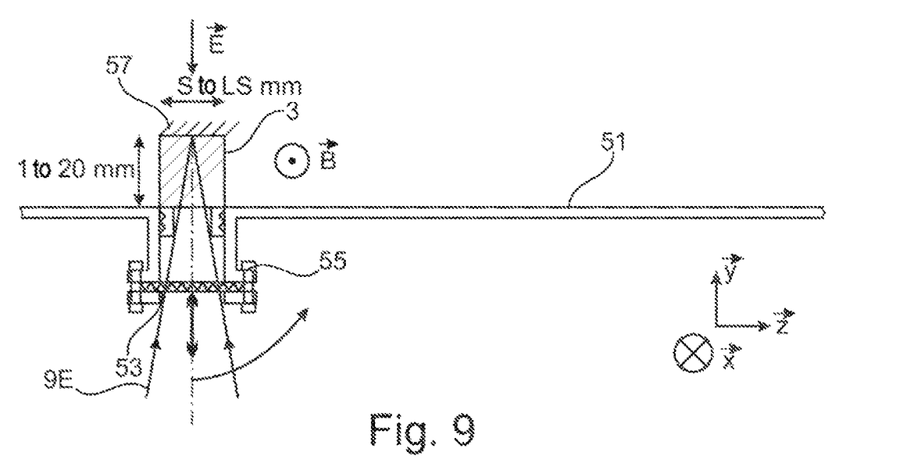
FIGS. 9 and 10 are simplified cross-sectional diagrams of one exemplary embodiment of a measurement head of FIG. 8.
Figure 10:
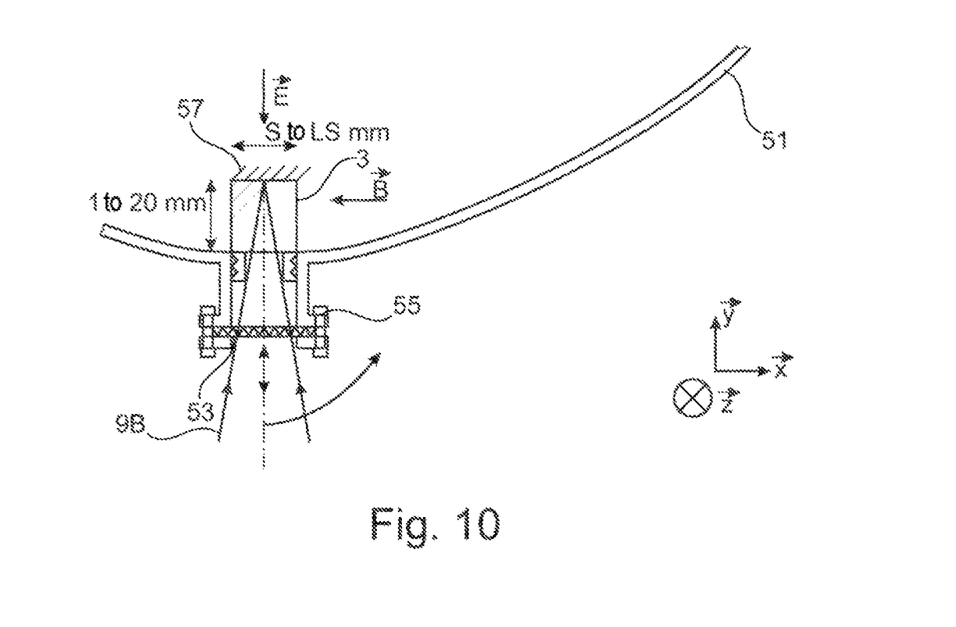

FIGS. 9 and 10 are simplified cross-sectional diagrams of an exemplary embodiment of a probe head 42 integrated in the metal casing 51 in two cutting planes that are perpendicular to one another.

As may be seen in FIGS. 9 and 10, the measurement cell 3 is arranged inside the metal casing 51 and notably fixed to the inner part of the metal casing 51.

To this end, the metal casing 51 comprises, at the measurement cell 3, a window 53 fixed by a flange 55 in order to allow the light beam 9E (FIG. 9) and 9B (FIG. 10) to pass through.

A rear wall 57 of the measurement cell 3 opposite the window 53 is reflective or provided with a mirror.

Thus, in order to detect the electric field E (FIG. 9), the light beam 9E evolves in a plane that is perpendicular to the magnetic field B. The light beam 9E enters the measurement cell 3 at a certain angle, is reflected by the rear wall 57 so as to then be sent to the measurement base 43.

In this configuration, only the collinear component of the light beam 9E contributes to the Stark effect. The size of the measurement cell 3 may be relatively small, since the light beam 9E passes through the measurement cell 3 twice (outward and return journey).

Then, in order to detect the magnetic field (FIG. 10), the light beam 96 evolves over a path in which it is partly collinear with the magnetic field B and with the electric field E. The light beam 96 enters the measurement cell 3 at a certain angle, is reflected by the rear wall 57 so as then to be sent to the measurement base 43.

In this configuration, only the collinear components of the electric field E and the magnetic field B of the light beam 96 contribute to the Zeeman effect and to the Stark effect, respectively. By firstly determining the electric field E using the assembly of FIG. 9, it is possible to determine the magnetic field B through measurement using the assembly of FIG. 10 by subtracting the contribution of the electric field E, which is known from the measurement using the assembly of FIG. 9, from the calculated measurement result. The size of the measurement cell 3 may be relatively small, since the light beam 9B passes through the measurement cell 3 twice (outward and return journey).

Hereinafter, one specific example will be given for current and voltage measurements, which example is applicable to all of the described embodiments.

It is assumed that the alkaline gas used in the measurement cell 3 is for example rubidium for the Stark effect and the Zeeman effect.

The relationship between the current in amperes (A) and the angle of rotation of the polarization $\theta_z$ for the Zeeman effect is given by:

$$\theta_Z = A_{Zeeman} \cdot \frac{l_B \cdot w}{r} \cdot I \quad \text{(eq. 17)}$$

where
r is the distance between the current conductor 31 and the measurement cell 3 in mm,
w is the diameter of the light beam 9 in the measurement cell 3 in mm,
$l_B$ is the length travelled in mm of that part of the path of the light beam 9B that is collinear with the magnetic field B.

$$4 \cdot 10^{-4} \text{rad} \cdot \frac{mm}{mm^2}/A < A_{Zeeman} < 1{,}2 \cdot 10^{-3} \text{rad} \cdot \frac{mm}{mm^2}/A,$$

this range is dependent on the chosen energy transition of rubidium. By inverting this equation, it is therefore possible to return to the current in the current conductor 31.

The relationship between the voltage U in kV and the angle of rotation $\theta_s$ for the Stark effect is given by:

$$\theta_S = A_{Stark} \cdot \frac{l_E \cdot w}{\left(r \ln\left(\frac{r_0}{r}\right)\right)^2} \cdot U^2 \quad \text{(eq. 18)}$$

where
$r_0$ the radius of the current conductor 31 in mm,
r is the distance between the current conductor 31 and the measurement cell 3 in mm,
$l_E$ is the length traveled in mm of that part of the path of the light beam 9E that is collinear with the electric field E.

$$4 \cdot 10^{-3} \text{rad} \cdot \frac{mm^2}{mm^2}/kV^2 < A_{Stark} < 1{,}2 \cdot 10^{-2} \text{rad} \cdot \frac{mm^2}{mm^2}/kV^2$$

this range is dependent on the chosen energy transition of rubidium. By inverting this equation, it is therefore possible to return to the voltage.

Alternating current and voltage measurement:

When applying an alternating voltage $V(t) = V_o \cos(\omega t)$, an electric field defined by the following relationship is obtained:

$$E(t) = \frac{V(t)}{r \ln\left(\frac{r_0}{r}\right)} \quad \text{(eq. 19)}$$

An angle of rotation is thus measured, given by the following relationship:

$$\theta_E(t) = \psi_E \cdot n_{al} \cdot \ell \cdot E(t)^2 \quad \text{(eq. 20)}$$

$$\theta_E(t) = \frac{\psi_E \cdot n_{al} \cdot \ell \cdot E_0^2}{2}[1 + \cos(2\omega t)] \quad \text{(eq. 21)}$$

A signal formed of 2 components is then obtained:
a continuous component
an alternating component with a frequency 2 times greater
When applying an alternating current $I(t) = I_o \cos(\omega t)$, a magnetic field defined by the following relationship is obtained:

$$B(t) = 4\pi\mu_0 \frac{I_0}{R} \quad \text{(eq. 22)}$$

An angle of rotation is thus measured, given by the following relationship:

$$\theta_B(t) = \psi_B \cdot n_{al} \cdot \ell \cdot B(t) \quad \text{(eq. 23)}$$

$$\theta_B(t) = \psi_B \cdot n_{al} \cdot \ell \cdot B_0 \cos(\omega t) \quad \text{(eq. 24)}$$

It is therefore understood that the present invention is distinguished by its small size, the active part (alkaline gas in the measurement cell 3) for the current and the voltage being able to be smaller than 10 cm$^3$ by volume.

Since the active part is a gas in a sealed measurement cell 3, the physical measurement is absolute and does not drift over time. The only drift parameters are controllable parameters (temperature) or parameters that are able to be calibrated in the remote part.

The only component subject to wear is potentially the light source 7, which may be remote from the conductor 31. Maintenance is therefore simple and easy.

The optical measurement presented above allows a sensitive measurement with a high bandwidth.

As described above, the measurement device is easy to implement. The various photodetectors do not need to be in contact with the current conductor 31 in order to measure the current and the voltage. This also provides galvanic isolation of the measurement chain from the electric power grid.

Lastly, the measurement device 1 makes it possible to measure currents and voltages in direct current mode and in alternating current mode.

The invention claimed is:

1. A measurement device (1) for measuring a magnetic field (B) and/or an electric field (E), comprising:
    a measurement cell (3) containing a gas sensitive to a Zeeman effect and/or to a Stark effect, in particular an alkaline gas, and arranged in a magnetic field (B) and/or electric field (E),
    a polarized light source (7) with a wavelength tuned to an absorption line of the gas sensitive to the Zeeman effect and/or to the Stark effect and that emits a light beam (9) passing through said measurement cell (3),
    at least one polarimetry system (11) configured to measure a first parameter corresponding to a rotation of a polarization angle due to the light beam (9) passing into the measurement cell (3) containing the gas sensitive to the Zeeman effect and/or to the Stark effect, the first parameter being dependent on a temperature in the measurement cell (3),
    an absorption measurement system (13) configured to measure a second parameter corresponding to an absorption rate of the light beam (9) by the gas sensitive to the Zeeman effect and/or the Stark effect in the measurement cell (3), this second parameter being dependent on the temperature in the measurement cell (3), and
    a processing unit (15) configured to combine the measurement of the first parameter corresponding to the rotation of the polarization angle and the second parameter corresponding to the absorption rate measured by the absorption measurement system in order to extract therefrom a third and/or fourth, parameter independent of the temperature in the measurement cell (3) corresponding to the electric field (E) and/or magnetic field (B) to be measured, respectively.

2. The measurement device as claimed in claim 1, wherein the alkaline gas is selected from the group consisting of: rubidium, lithium, sodium, potassium, caesium and francium.

3. The measurement device as claimed in claim 1, wherein the at least one polarimetry system (11) is configured to measure two first parameters corresponding respectively to the rotation of a polarization angle due to the light beam (9) passing into the measurement cell (3) containing a sensitive gas induced by the Zeeman effect, on the one hand, and by the Stark effect, on the other hand, the two first parameters being dependent on the temperature in the measurement cell (3),
    the processing unit (15) is configured to combine the measurement of the two first parameters corresponding to the rotation of the polarization angle induced by the Zeeman effect, on the one hand, and by the Stark effect, on the other hand, with the second parameter corresponding to the absorption rate measured by the absorption system in order to extract therefrom a third and a fourth parameter independent of the temperature in the measurement cell (3) corresponding to an electric field (E) and magnetic field (B) to be measured, respectively.

4. The measurement device as claimed in claim 1, wherein the processing unit (15) is configured to extract the temperature in the measurement cell (3) from the absorption measurement by the absorption system.

5. The measurement device as claimed in claim 1, wherein the measurement device further comprises a measurement head (33) comprising a beam splitter (35) for splitting the light beam (9) from the polarized light source (7) into at least two partial light beams (9E, 9B) and reflectors (37, 39) for defining two measurement branches perpendicular to one another, the measurement cell (3) being arranged in the measurement head (33) at a intersection of the at least two partial beams (9E, 9B).

6. The measurement device as claimed in claim 5, wherein the measurement head (33) is connected to the polarized light source (7), the polarimetry system (11) and the absorption measurement system (13) by optical fibers (41).

7. The device as claimed in claim 1, wherein a path of the light beam (9) passing through the measurement cell (3) has at least one component collinear with the magnetic field (B) or electric field (E) to be measured or is collinear with the magnetic field (B) or electric field (E) to be measured.

8. The device as claimed in claim 1, wherein the measurement cell (3) is a cube having a first side of a length between 0.1 mm and 20 mm and a second side of a length between 0.1 mm and 25 mm or a cylinder of a height between 0.1 mm and 20 mm and a diameter between 0.1 mm and 25 mm.

9. The device as claimed in claim 1, wherein the polarimetry system (11) is a balanced polarimetry system arranged downstream of the measurement cell (3) and comprising a polarizing beam splitter (17) as well as two associated photodetectors (19, 21).

10. The device as claimed in claim 1, wherein the polarimetry system (11) comprises a polarizer (44) arranged downstream of the measurement cell (3) and an associated photodetector (19E, 19B), the beam at the input of the measurement cell (3) being linearly polarized.

11. The device as claimed in claim 1, wherein a path of the light beam (9) passing through the measurement cell (3) has at least one component collinear with the magnetic field (B) or electric field (E) to be measured or is collinear with the magnetic field (B) or electric field (E) to be measured;

wherein the polarimetry system (11) comprises a polarizer (44) arranged downstream of the measurement cell (3) and an associated photodetector (19E, 19B), the beam at the input of the measurement cell (3) being linearly polarized; and wherein a beam splitter (46) is arranged downstream of the measurement cell (3) and upstream of a polarizer (44) in order to direct part of the beam to a photodetector (25) of the absorption measurement system (13).

12. The device as claimed in claim 1, wherein the absorption measurement system (13) comprises a first and a second beam splitter plate (23, 27) arranged respectively upstream and downstream of the measurement cell (3), and two photodetectors (25, 29) associated with each of the first and second beam splitter plates (23, 27) and configured to detect a luminous intensity of the light beam (9) upstream and downstream of the measurement cell (3).

13. The device as claimed in claim 1, wherein the light source (7) is a laser, notably a laser diode.

14. The device as claimed in claim 13, wherein a single laser light source (7) is used to measure both at least one electric field (E) and at least one magnetic field (B).

15. A unit for measuring a current and/or a voltage in a medium-voltage or high-voltage electrical conductor (31), comprising at least one measurement device (1) as claimed in claim 1, and the processing unit (15) is furthermore configured to determine a voltage relative to ground and/or an electric current flowing in the conductor (31) on a basis of a distance between the electrical conductor (31) and the measurement cell (3).

16. A gas-insulated substation comprising a metal casing (51) enclosing a medium-voltage or high-voltage electrical conductor (31), wherein the metal casing comprises the measurement device (1) as claimed in claim 1, the measurement cell (3) of which is arranged inside the substation, fixed to an inner part of the metal casing (51).

* * * * *